(12) United States Patent
Bui et al.

(10) Patent No.: US 12,038,942 B1
(45) Date of Patent: Jul. 16, 2024

(54) MBSE TO GRAPH DATABASE TRANSLATOR

(71) Applicants: Alvin Hau Bui, Garden Grove, CA (US); Andrew Chi Kit Chan, Brea, CA (US); Justin Thomas Mulligan, San Diego, CA (US); Melanie Franklin, Artesia, CA (US)

(72) Inventors: Alvin Hau Bui, Garden Grove, CA (US); Andrew Chi Kit Chan, Brea, CA (US); Justin Thomas Mulligan, San Diego, CA (US); Melanie Franklin, Artesia, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 18/182,955

(22) Filed: Mar. 13, 2023

(51) Int. Cl.
*G06F 7/00* (2006.01)
*G06F 16/25* (2019.01)
*G06F 16/901* (2019.01)

(52) U.S. Cl.
CPC ........ *G06F 16/258* (2019.01); *G06F 16/9024* (2019.01)

(58) Field of Classification Search
CPC ............... G06F 16/258; G06F 16/9024; G06F 16/2425; G06F 16/219; G06F 16/24524; G06F 16/27; G06F 16/2453; G06F 16/2455; G06F 16/2282; G06F 16/2246; G06F 16/322; G06F 16/9027; G06F 18/2323; G06F 18/24323; G06F 40/14; G06F 40/137; G06F 40/154; G06F 2207/222
See application file for complete search history.

(56) References Cited

U.S. PATENT DOCUMENTS

| | | | |
|---|---|---|---|
| 9,916,187 B2 | 3/2018 | Schmid et al. | |
| 10,445,321 B2 | 10/2019 | Song et al. | |
| 10,922,446 B2 | 2/2021 | Gottschlich et al. | |
| 11,347,919 B2 | 5/2022 | Heilmann et al. | |
| 2005/0015240 A1* | 1/2005 | Appleby | G06F 40/45 704/9 |
| 2012/0134271 A1* | 5/2012 | Gantenbein | H04L 43/0882 370/235 |
| 2014/0019112 A1 | 1/2014 | Canedo et al. | |
| 2019/0114368 A1* | 4/2019 | Hood | G06F 16/9024 |
| 2021/0286848 A1 | 9/2021 | Bedi et al. | |
| 2022/0368598 A1 | 11/2022 | Thorup et al. | |
| 2022/0368599 A1 | 11/2022 | Thorup et al. | |
| 2023/0022966 A1* | 1/2023 | Parisi | G06F 16/65 |

* cited by examiner

*Primary Examiner* — Mohammad A Sana
(74) *Attorney, Agent, or Firm* — Tarolli, Sundheim, Covell & Tummino LLP

(57) ABSTRACT

A non-transitory machine-readable medium having machine-executable instructions includes a translator, the machine-readable instructions for the translator being executable by a processor core to perform operations. The operations include translating records in model-based system engineering (MBSE) data for an MBSE platform to identify nodes and links for graph data of a graph database. The operations also include populating the graph data with the nodes and links from the translated nodes. A query to the graph data of the graph database reveals a subset of nodes of the nodes and links between the nodes of the subset of nodes and other nodes of the nodes of the graph data.

18 Claims, 12 Drawing Sheets

US 12,038,942 B1

MBSE TO GRAPH DATABASE TRANSLATOR

TECHNICAL FIELD

This disclosure relates to translating model-based systems engineering (MBSE) data for an MBSE platform to graph data for a graph database.

BACKGROUND

Model-based systems engineering (MBSE), is the formalized application of modeling to support system requirements, design, analysis, verification and validation activities beginning in the conceptual design phase and continuing throughout development and later life cycle phases. MBSE is a technical approach to systems engineering that focuses on creating and exploiting domain models (aka Chocolate Factory Diagrams) as the primary means of information exchange, rather than on document-based information exchange. MBSE technical approaches are commonly applied to a wide range of industries with complex systems, such as aerospace, defense, rail, automotive, manufacturing, etc.

A graph database (GDB) is a database that uses graph structures for semantic queries with nodes, edges (alternatively referred to as links), and properties to represent and store data. A key concept of the system is the graph (or edge or relationship). The graph relates the data items in the store to a collection of nodes and edges, the edges representing the relationships between the nodes. The relationships allow data in the store to be linked together directly and, in many cases, retrieved with one operation. Graph databases hold the relationships between data as a priority. Querying relationships is fast because relationships are stored in the database. Relationships can be intuitively visualized using graph databases, making them useful for heavily interconnected data.

SUMMARY

One example relates to a non-transitory machine-readable medium having machine-executable instructions comprising a translator, the machine-readable instructions for the translator being executable by a processor core to perform operations. The operations include translating records in model-based system engineering (MBSE) data for an MBSE platform to identify nodes and links for graph data of a graph database. The operations also include populating the graph data with the nodes and links from the translated nodes, wherein a query to the graph data of the graph database reveals a subset of nodes of the nodes and links between the nodes of the subset of nodes and other nodes of the nodes of the graph data.

Another example relates to a system for translating data. The system includes a non-transitory memory storing machine readable instructions and a processor that accesses the non-transitory memory and executes the machine-readable instructions. The machine readable-instructions are executable by the processor to perform operations. The operations include translating records in MBSE data for an MBSE platform to identify nodes and links for graph data of a graph database. The translating includes assigning a record title extracted from a given record of the records to a title of a given node of the nodes. The translating also includes determining an element field for the given node based on element field of the given record. The operations also include populating the graph data with the nodes and links from the records of the MBSE data. The populating includes identifying fields in the given record that reference other records of the MBSE data. The populating also includes generating a set of links between the given node and other nodes in the graph data based on the identified fields of the given record of the MBSE data. A query to the graph database reveals a subset of nodes of the nodes and links between the nodes of the subset of nodes and other nodes of the nodes of the graph data.

Yet another example relates to a method for translating data. The method includes translating, by a translator executing on one or more computing devices, records in MBSE data for an MBSE platform to identify nodes and links for graph data of a graph database. The method also includes populating, by the translator, the graph data with the nodes and links from the records in the MBSE data. A query to the graph database reveals a subset of nodes of the nodes and links between the nodes of the subset of nodes and other nodes of the nodes of the graph database.

DETAILED DESCRIPTION

This description relates to a system for translating model-based systems engineering (MSBE) data to graph data for a graph database. The system includes a translator executing on a computing platform (e.g., a server or other computing device) that translates records (e.g., nodes) in an MBSE platform (e.g., a software platform) to identify nodes and links for graph data of a graph database. This translating also includes assigning a record title (e.g., a node identifier) extracted from a given record of the MBSE data to a title of a given node of the graph data. This translation also includes determining a category for the given node based on an element field of the given record. The translating also includes populating the graph data with the nodes and links from the records in the MBSE data. The populating includes identifying fields in the given record that identify other records of the MBSE platform and generating a set of links for the graph data between the given node and other nodes in the graph database based on the identified fields of the given record.

The graph database can be queried to reveal a subset of nodes of the graph data and links between the nodes of the graph data stored in the graph database. Complex queries can reveal a myriad of metrics related to the graph data (and to the MBSE data). These metrics can include behavior metrics, structural metrics, requirement metrics, interface metrics and parametric metrics to characterize relationships (or a lack thereof) between nodes in the graph data. Accordingly, the graph data is employable to visualize relationships between records in the MBSE data that would otherwise be obfuscated.

Figure 1:
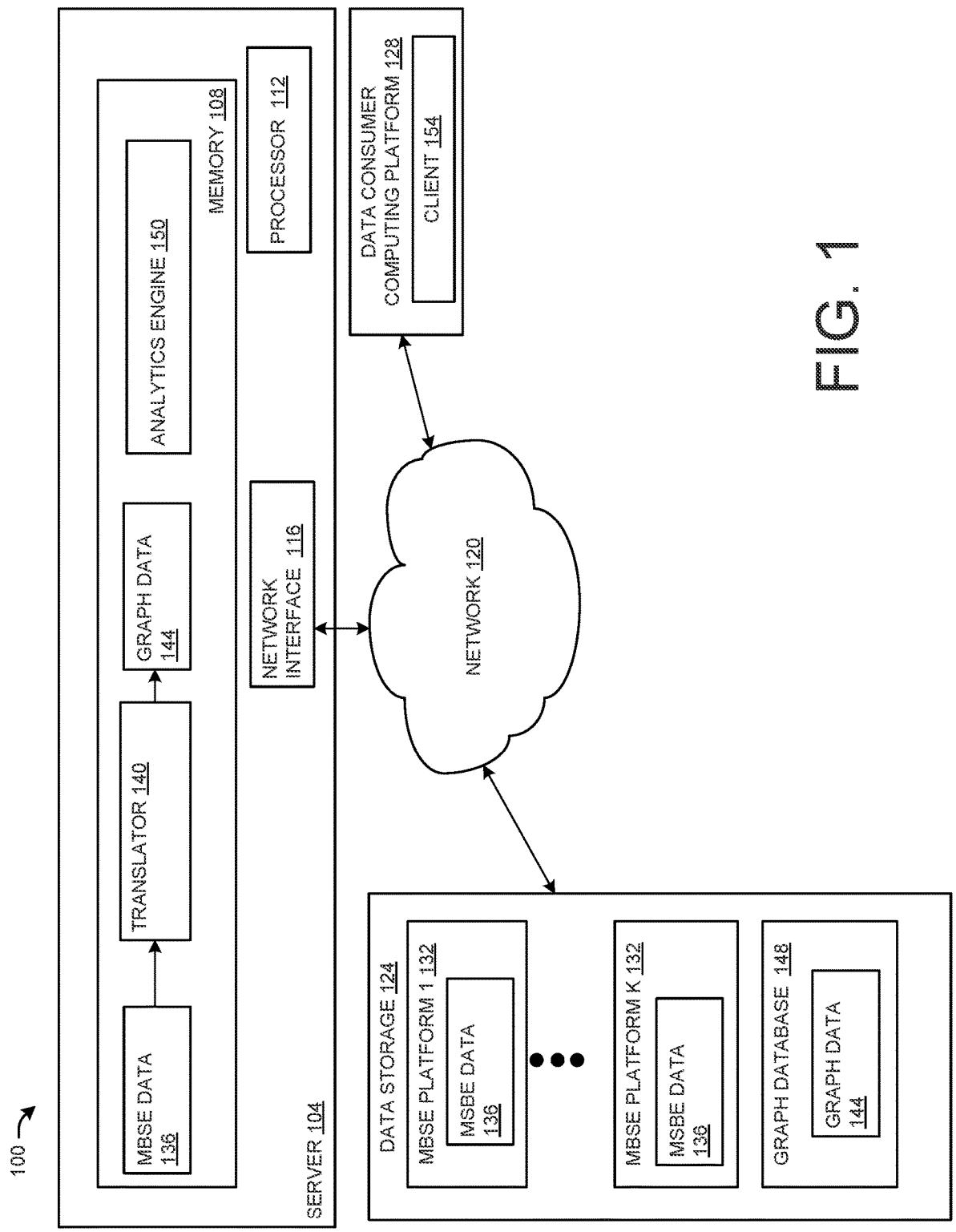
FIG. 1 illustrates an example of a system for translating database data and querying the translated data to reveal metrics.

FIG. 1 illustrates an example of a system 100 for translating MBSE data into graph data for a graph database and querying the translated data to reveal metrics. The system 100 can include a server 104 (e.g., a computing platform) that can include a memory 108 for storing machine-readable instructions and data and a processor 112 for accessing the memory 108 and executing the machine-readable instructions. The memory 108 represents a non-transitory machine-readable medium, such as random access memory (RAM), a solid state drive, a hard disk drive or a combination thereof. The processor 112 (alternatively referred to as a processing unit) can be implemented as one or more processor cores. The server 104 can include a network interface 116 (e.g., a network interface card) configured to communicate with other computing platforms via a network 120, such as a public network (e.g., the Internet), a private network (e.g., a local area network (LAN)) or a combination thereof (e.g., a virtual private network).

The server 104 could be implemented in a computing cloud. In such a situation, features of the server 104, such as the processor 112, the network interface 116, and the memory 108 could be representative of a single instance of hardware or multiple instances of hardware with applications executing across the multiple of instances (i.e., distributed) of hardware (e.g., computers, routers, memory, processors, or a combination thereof). Alternatively, the server 104 could be implemented on a single dedicated server or workstation.

Other computing platforms (e.g., computing devices) of the system 100 also communicate on the network 120. These other computing devices include a data storage 124 and a data consumer computing platform 128. For purposes of simplification of explanation, details of the data storage 124 and the data consumer computing platform 128 are omitted. However, it is understood that the data storage 124 and the data consuming computing platform 128 can be implemented in a similar manner as the server 104. In fact, in some examples, the server 104, the data storage 124 and the data consumer computing platform 128 are operating on the same computing device. Unless otherwise indicated, it is presumed that the modules of the data storage 124 and the data consumer computing platform 128 are stored in a non-transitory memory that is access by a processing unit (e.g., one or more processing cores).

The data storage 124 includes K number of MBSE platforms 132 (e.g., an MBSE tool, such as an analytics tool), where K is an integer greater than or equal to one. Each of the MBSE platforms 132 include MBSE data 136 stored therein. Each instance of MBSE data 136 in the K number of MBSE platforms 132 includes a set of records (e.g., MBSE models), that are alternatively referred to as nodes. Each node in the set of nodes includes key-value fields. In some examples, the nodes of a given MBSE platform 132 can refer to nodes of another MBSE platform 132. For instance, the MBSE data 136 of the first MBSE platform 132 (MBSE platform 1) can include a node with a reference to a node present in the MBSE data 136 of the Kth MBSE platform 132 (e.g., MBSE platform K). In other examples, the nodes of a given MBSE platform 132 refer to nodes in the same MBSE platform 132.

The memory 108 of the server 104 includes a translator 140 that translates MBSE data 136 into graph data 144. More specifically the translator 140 retrieves MBSE data 136 from each of the K number of MBSE platforms 132 (or some subset thereof) and generates the graph data 144. In some examples, the translator 140 employs an application programming interface (API) to retrieve the MBSE data 136. The graph data 144 employs graph structures for semantic queries with nodes, links (edges), and properties to represent and store data. The graph data 144 is stored in a graph database 148, which graph database 148 is stored in the data storage 124. In some examples, the translator 140 employs an API to store the graph data 144 in the graph database 148.

Figure 2:
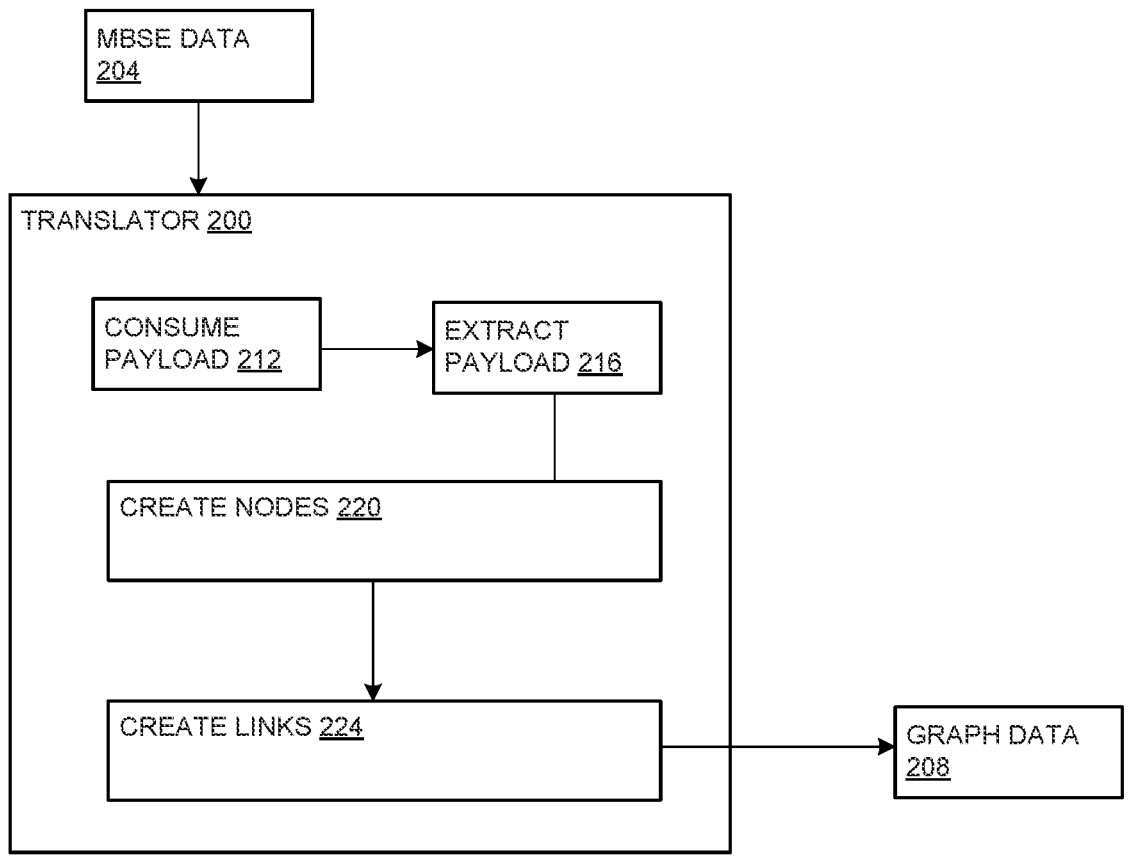
FIG. 2 illustrates a flowchart diagram depicting operations of a translator.

FIG. 2 illustrates a flowchart diagram depicting operations of a translator 200, such as the translator 140 of FIG. 1. The translator 200 executes on a computing platform, such as the server 104 of FIG. 1. The translator 200 receives MBSE data 204, such as the MBSE data 136 of FIG. 1, and outputs graph data 208, such as the graph data 144 of FIG. 1.

At 212, the translator 200 consumes a payload of a set of nodes in the MBSE data 204. In some examples, the nodes in the set of nodes are implemented in the JavaScript Object Notation (JSON) format. At 216, the translator 200 extracts the payload (e.g., data fields, such as key-value pairs) from the nodes in the MBSE data 204. At 220, the translator 200 creates nodes and assigns categories for the graph data 208 based on an element field (e.g., an element type) of each corresponding node extracted from MBSE data 204. At 224, the translator 200 generates (low level) links between the nodes in the graph data 208. Additionally, at 224, the translator 200 generates abstract links (e.g., bypass links) between nodes of the graph data 208 to accelerate query speed. The nodes with the links are output as the graph data 208.

Figure 3:
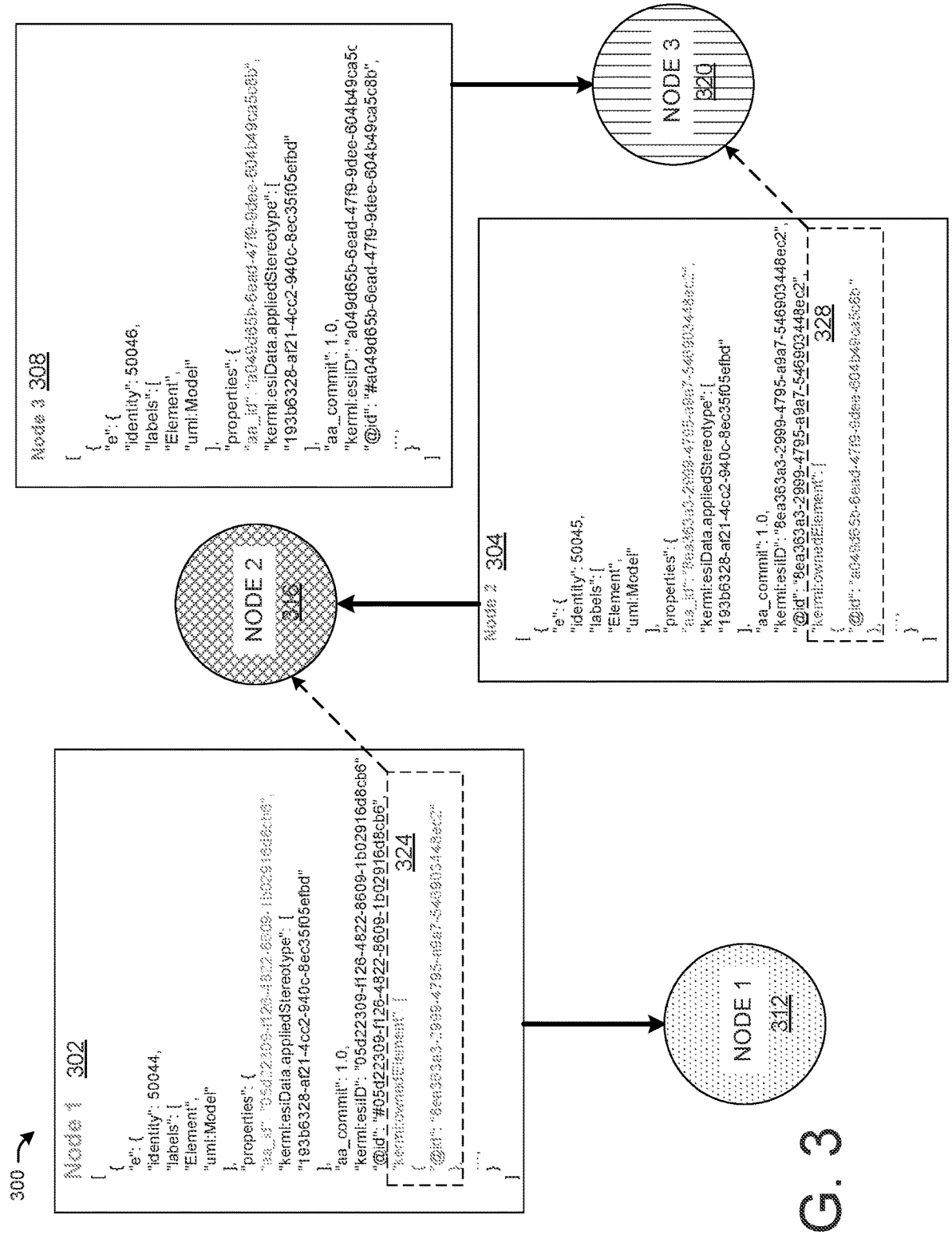
FIG. 3 is a diagram illustrating a first portion of translation operations of a translator.
Figure 4:
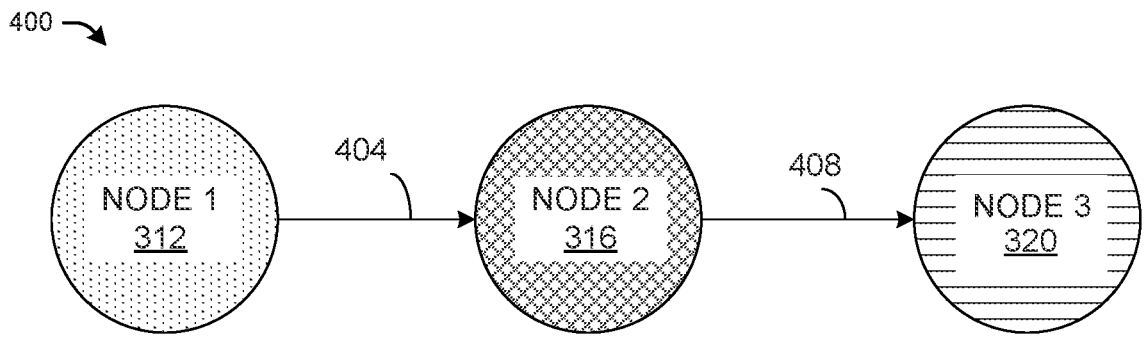
FIG. 4 illustrates a diagram of translator operations for creating links between nodes in graph data.
Figure 5:
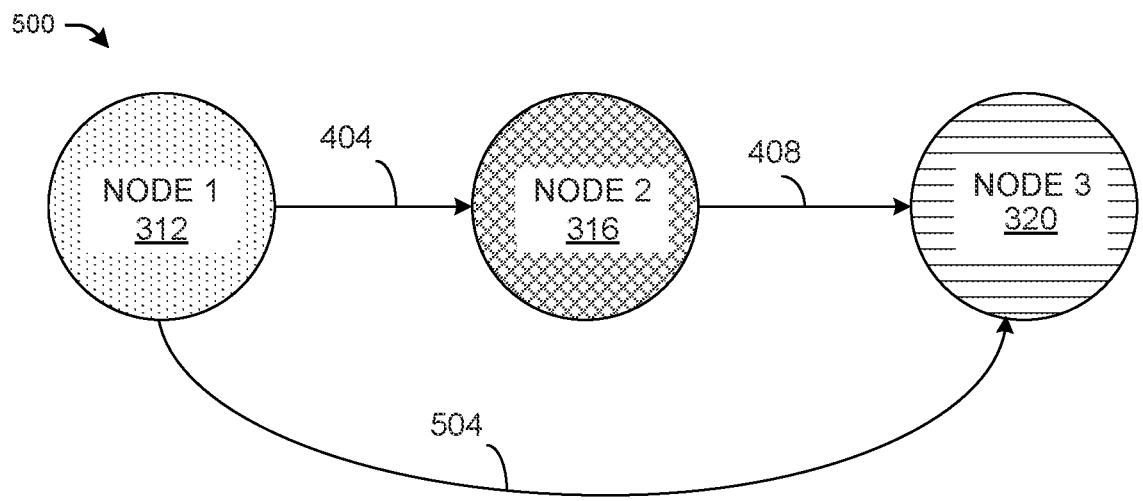
FIG. 5 is a diagram illustrating additional operations of the translator creating abstract links.

FIGS. 3-5 are diagrams depicting the operations of the translator 200 of FIG. 2 and the translator 140 of FIG. 1. In particular, FIG. 3 is a diagram 300 illustrating a first portion of the operations of the translator 200 of FIG. 2 and the translator 140 of FIG. 1. In FIG. 1, three nodes, namely Node 1 302, Node 2 304 and Node 3 308 are extracted from MBSE data (e.g., the MBSE data 204 of FIG. 2). Node 1 302, Node 2 304 and Node 3 308 include data fields implemented as key-value pairs. In particular, Node 1 302, Node 2 304 and Node 3 308 include a node identifier (e.g., a record identifier) key, labeled "aa_id", and an associated value. Further, the Node 1 300, Node 2 304 and Node 3 308 include an element type that is employable to generate a corresponding node for graph data (e.g., the graph data 208 of FIG. 2), as the operation 220 described in FIG. 2. In the example illustrated, Node 1 302 (e.g., a MBSE record) is translated to Node 1 312 (a graph node), Node 2 304 is translated to Node 2 316 (a graph node) and Node 3 308 is translated to Node 3 320 (a graph node).

Additionally, as described in operation 224 of FIG. 2, links are created for the node, namely the Node 1 312, Node 2 316 and Node 3 320 (graph nodes). To create the links, the translator examines the key-value pairs of each node and identifies pairs that reference another node. For example, as illustrate by a box 324, Node 1 302 (corresponding to Node 1 312) includes a key-value pair with a value corresponding to the identifier of Node 2 304 (corresponding to Node 2 316), such that a link between Node 1 312 and Node 2 316 is created. Similarly, as illustrated by a box 328, Node 2 304 includes a key-value pair with a value corresponding to the identifier of Node 3 308 (corresponding to Node 3 320), such that a link between Node 2 316 and Node 3 320 is created.

Furthermore, key-value pairs that do not identify other nodes can identify a set of activities of a given node (e.g., record), such as activities for Node 1 302, Node 2 304 and/or Node 3 308.

FIG. 4 illustrates a diagram 400 of translator operations for creating links between nodes, such as the operation 224 of FIG. 2. The diagram 400 includes the Node 1 312, the Node 2 316 and the Node 312 generated in the diagram 300 of FIG. 3. As illustrated, a first link 404 is provided between Node 1 312 and Node 2 316, and a second link 408 is provided between Node 2 316 and Node 3 320. In some examples, the links can include values associated the key-value pairs extracted from the MBSE data.

FIG. 5 is a diagram 500 illustrating additional operations of the translator creating abstract links, such as the operation 224 of FIG. 2. The diagram 500 includes Node 1 312, Node 2 316 and Node 312 generated in the diagram 400 of FIG. 3. As illustrated, there is a first link 404 between Node 1 312 and a second link 408 between Node 3 320. Accordingly, the translator generates an abstract link 504, or bypass link, showing a direct connection between Node 1 312 and Node 3 320. In this manner, a query that reveals Node 1 312 would show a link labeled with a type of "TWO_LINKS_AWAY" (or similar) to Node 3.

Referring back to FIG. 1, the graph database 148 that stores graph data 144 is able to be queried by an external system, such as an analytics engine 150 stored in the memory 108 of the server 104. The analytics engine 150 is accessible by a client 154 (e.g., a web browser or a dedicated client) operating on the data consumer computing platform 128. The results of the query provide nodes and characterize interconnections between nodes. The results can be graphically depicted in an output of the client 154, such as in a graphical user interface (GUI).

The analytics engine 150 can be employed to execute a query on the graph database 148 based on input from the client 154. Moreover, the analytics engine 150 can organize the data into a format consumable by a user of the data consumer computing platform 128. The analytics engine 150 is employable to determine metrics of the graph data 144, such as behavioral metrics, structural metrics, requirement metrics, interface metrics and/or parametric metrics. These metrics are formatted into the consumable format output by the client 154.

To facilitate understanding of the benefits of implementing the system 100, consider an extended given example ("the given example") where the system 100 is employed in the development of an aircraft, such as a fighter jet. Aircraft are inherently complicated machines, often requiring a plethora of different levels of design that include but are not limited to, actions (e.g., operations) of the aircraft (e.g., maneuvers), constraints (e.g., acceleration) computer aided drafting (CAD) drawings, build of materials (BOM) lists, software modules, vendor coordination, etc. Moreover, this list is not meant to be exhaustive.

Continuing with the given example, the nodes in the K number of MBSE platforms 132 can include specifications for the aircraft. In a simple example, suppose that a first node in a given set of nodes of an instance of MBSE data 136 (e.g., stored in the first MBSE platform 132) represents specifications, including a weight, of a wing of the aircraft. In such a situation, the first node can include references to CAD drawings (e.g., in a particular key-value data field) of a second node of the graph data 144. Additionally, the first node can include a reference to a BOM of a third node in the graph data 144. Thus, a change to the weight of the wing would necessitate changes to the CAD drawings (e.g., change in shape) and the BOM (e.g., change in an amount of material). Using a conventional approach, a cumbersome textbased search of the key-value fields in the MBSE data 136 of the K number of MBSE platforms 132 would be needed. In contrast, by converting the first node in the given example to a first node in the graph data 144 (e.g., a graph node), a graph representing the connections, along with labels are provided as a graphical output to the client 154. In this manner, in the given example, a user of the client 154 can quickly ascertain the impact of changing a particular feature (e.g., the weight) of the wing, namely that the change in the weight will have an impact on the second node (including the reference to the CAD drawing) and the third node (including the reference to a BOM).

Figure 6:
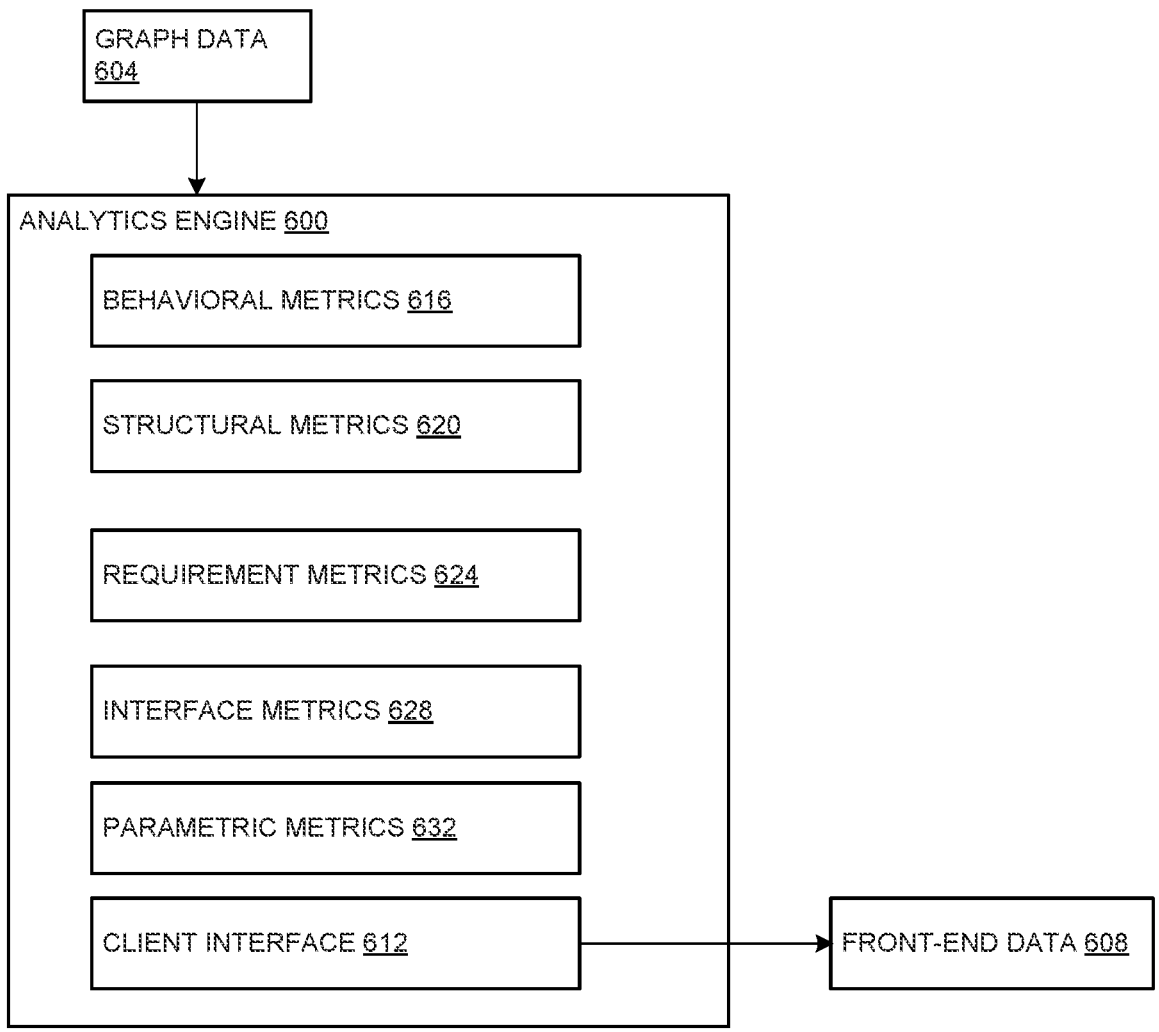
FIG. 6 illustrates operational modules (e.g., software modules) of an analytics engine for querying graph data.

FIG. 6 illustrates operational modules (e.g., software modules) of an analytics engine 600, such as the analytics engine 150 of FIG. 1. The analytics engine 600 executes on a computing platform, such as the server 104 of FIG. 1. The analytics engine 600 receives graph data 604, such as the graph data 144 from the graph database 148 of FIG. 1, and outputs front-end data 608, that can be output on a client, such as the client 154 of FIG. 1.

The analytics engine 600 includes a client interface 612 that provides the front-end data 608. The client interface 612 communicates with a selected metrics module of a set of metrics modules of the analytics engine 600 in response to a request from the client. In particular, the client interface 612 provides an interface to the client to allow the client to execute queries and selectable metrics on the graph data 604. The metrics modules include a behavioral metrics module 616. The behavior metrics includes functional requirements analysis and coupling and cohesion of nodes in the graph data 604.

Figure 7:
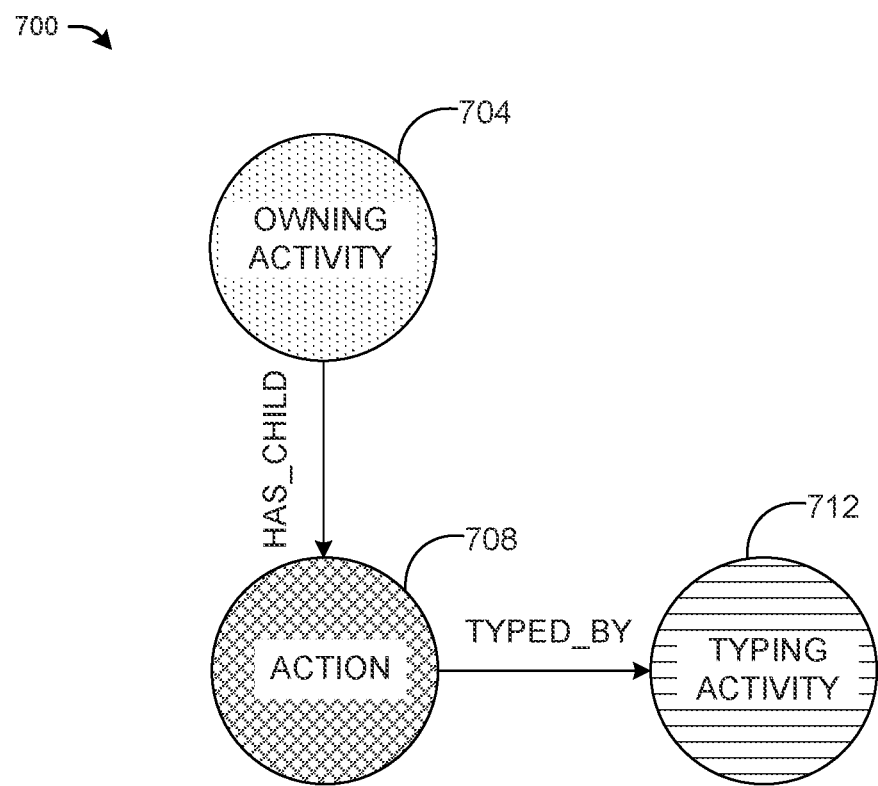
FIG. 7 is a diagram representing a response to a request from a client for a query to identify whether a particular action includes (or does not include) activities in graph data.
Figure 8:
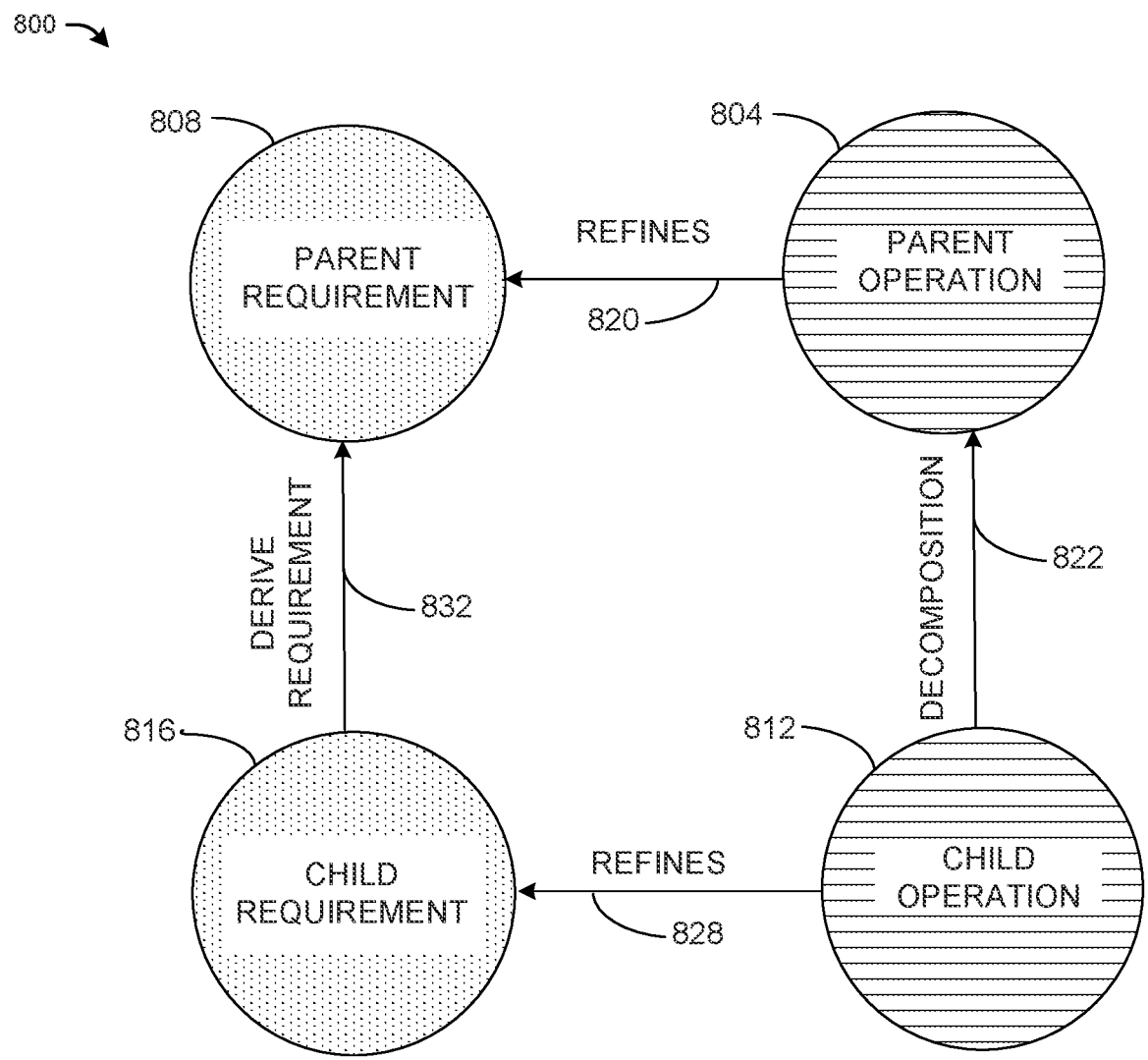
FIG. 8 is a diagram that illustrates functional requirements analysis (FRA) executed by a behavioral metrics model on nodes of graph data.
Figure 9:
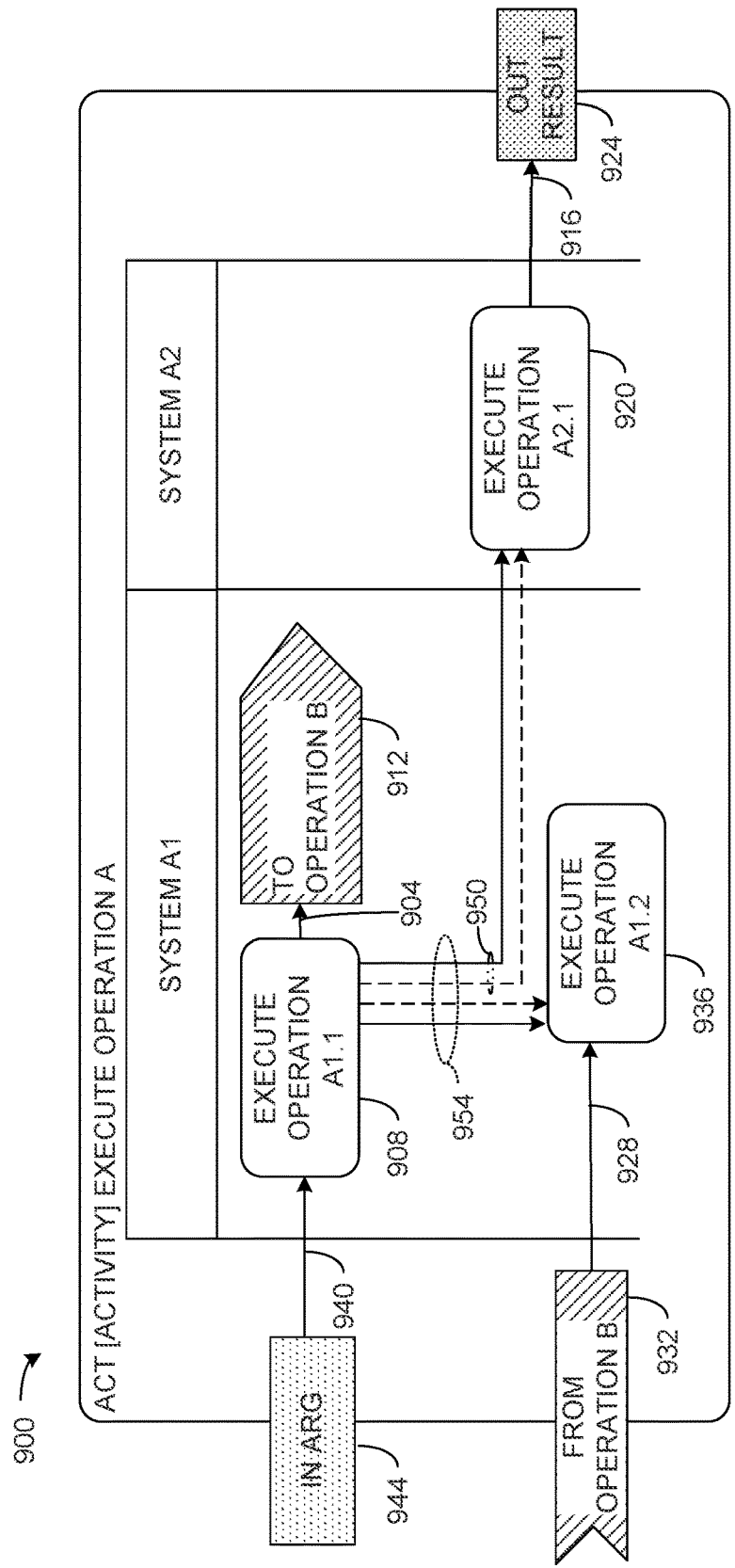
FIG. 9 illustrates a diagram representing coupling analysis executed by a behavioral metrics module on graph data.

FIGS. 7-9 illustrate a variety of operations of the behavioral metrics module 616 executed on the nodes (e.g., elements) of the graph data 604 of FIG. 6. For purposes of simplification, FIGS. 6-9 employ the same reference numbers to denote the same structures, and some structures are not reintroduced.

FIG. 7 is a diagram 700 representing a response to a request from a client (e.g., the client 154) for a query to identify whether a particular action includes (or does not include) activities. Responsive to this request, the behavioral metrics module 616 queries the graph data for node of the particular action and determines if the particular node has a null value (or otherwise empty value) in a behavior key field. Stated differently, the behavioral metrics module 616 determines if the particular nodes in the graph data 604 have a behavior key field with a value of null or empty.

In the given example, suppose that a first node 704 represents a node for an action of performing a maneuver. In this instance, suppose that a second node 708 represents an instance of a performance of a sub maneuver, represented with the label "HAS_CHILD". Additionally, the behavioral metrics module 616 determines if a link labeled "TYPED_BY" between the second node 708 and a third node 712 exists. Data characterizing the diagram 700 can be provided as the front-end data 608.

As demonstrated by the diagram 700, gap analysis on the graph data 604 can be executed to compare definitions (activities) with usage (actions). If actions are created without activities (e.g., behavior key field has a value of null), this is an indication that the behavioral definition for a node of the MBSE data (e.g., the MBSE data 136) was not created, and thus would not be accounted for in upstream and/or downstream analysis of a particular node. This upstream and/or downstream analysis can include requirements traceability, behavioral allocation to elements of a structure, etc. Moreover, the gap analysis can reveal that duplicate actions are created in the MBSE data, which could lead to conflicting definitions.

FIG. 8 is a diagram 800 that illustrates functional requirements analysis (FRA) executed by the behavioral metrics module 616 on nodes of the graph data. In the example illustrated, it is presumed that the client (e.g., the client 154 of FIG. 1) requested a complete square (or other logical loop) query. Responsive to the complete square query, the behavioral metrics module 616 returns each FRA square that includes two requirements and two operations.

More particularly, as illustrated in FIG. 8, a complete square metric, with a first node 804, a second node 808, a third node 812 and a fourth node 816 are returned in the complete square query. More generally, the first node 804, the second node 808, the third node 812 and the fourth node 816 provide a subset of nodes in the graph data that have links that form a logical loop. Suppose that in the given example, the first node 804 is a parent operation with a key-value field of "Thrust=Mach 100". The first node 804 includes a link 820 labeled "refines" to the second node 808 that includes a parent requirement of "the system must contribute Mach X". The first node 804 also includes a link 822 labeled "DECOMPOSITION" to the third node 812 that includes a child operation of "Thrust=Mach 50"). The third node 812 includes a link 828 to the fourth node 816 labeled "REFINES" that includes a child requirement of "The subsystem must contribute Mach Y". The fourth node 816 further includes a link 832 labeled "DERIVE REQUIREMENT" to the second node 808, completing the square.

By using FRA squares, patterns of nodes (elements) and relationships between nodes can be quickly identified. These patterns are not readily identifiable in MBSE data (e.g., the MBSE data 136 of FIG. 1) stored in an MBSE platform (e.g. the MBSE platforms 132 of FIG. 1). Accordingly, a complete square metric, as illustrated by the diagram 800 is employable to ensure that parent-to-child requirements align with parent-to-child operation decomposition, if present.

Additionally, in some examples, the complete squares query can include a query for FRA squares that are missing one link. In this situation, suppose that the link 822 (labeled "DECOMPOSITION") between the first node 804 and the third node 812 is absent in the graph data 604. In this situation, the behavioral metrics module 616 can return each square that would be completed if one link were to be added. This would include returning the nodes illustrated in the diagram 800 with the situation where the link 822 is absent. More generally, the behavioral metrics module 616 can identify a subset of nodes of the nodes in graph data that have links that are exactly one link away from forming a logical loop (e.g., an FRA square). This is provided as a one link warning metric in the front-end data 608.

The query for FRA squares that are missing one link can be employable to check for paths that are consistent and available (e.g., FRA square) and flagging paths that do not exist (e.g., the FRA squares missing one link). The one link warning metric flags paths that are one link from being a complete square, thereby flagging concerns in the architectural model of the MBSE data. This avoids future errors and saves development costs by identifying design defects early in a design process to ensure that requirements for a project are decomposed accurately.

Further still, in some examples, the complete squares query can include a query for single nodes. In this situation, suppose that the link 822 between the first node 804 and the second node 808 is absent and the link 828 between the fourth node 816 and the second node 808 is missing. In this situation, the behavioral metrics module 616 can identify the second node 808 as a single node that is not linked to Requirements and Operations node of an FRA square. More generally, the behavioral metrics module 616 can identify a subset of nodes in the graph data 604 of a particular category that are not linked to another node of the particular category.

A graph database allows users to easily identify links to other nodes. This feature is useful in situations where a certain type of node is expected to be linked to other nodes. For instance, in architecture models, it is common practice for Requirements and Operations nodes to be linked with other Requirement or Operations nodes. By flagging single nodes (e.g., a single node metric), such as the second node 808 (when the link 820 and the link 832 are absent), addressable issues are detectable. Similar to the one link warning metric, flagging single nodes also avoids future errors and saves development costs by identifying design defects early in a design process to ensure that requirements for a project are decomposed accurately.

FIG. 9 illustrates a diagram 900 representing coupling analysis executed by the behavioral metrics module 616 as a response to a request for a coupling score between behaviors (e.g., actions) of a given behavior of the graph data 604. The coupling score is alternatively referred to as a strength of the actions. To execute the coupling score, the behavioral metrics module 616 counts a number of send signal actions and accept event actions between nodes for the first behavior and a second behavior. This number is divided by a maximum number of send signal actions and accept event actions for nodes on a same level as the given node. In the diagram 900, suppose that the first behavior is "Operation A" and the second behavior is "Operation B". In this instance, nodes of Operation A are represented with boxes that have rounded corners, and could have a common color. Similarly, nodes of the second behavior also have a common color (represented as a pattern) In the diagram 900, the behavioral metrics module 616 counts the number of links between the nodes with the rounded corners and other nodes, which represent send signal actions and accept event actions. In the present example, there is a first link 904 coupling a first node 908 of Operation A, and a first node 912 of Operation B. Additionally, in the diagram 900, there is a second link 916 between a second node 920 of Operation A and an output 924. Further, there is a third link 928 between a second node 932 of Operation B and a third node 936 of Operation A. Still further, there is a fourth link 940 between an input node 944 and the first node 908 of Operation A. Thus, in the diagram 900, Operation A has four (4) links (representing send signal actions and accept event actions) between nodes of Operation A and other nodes. Additionally, there are two links (representing send signal actions and accept event actions) between Operation A and Operation B, namely the first link 904 and the third link 928. Thus, the coupling score between Operation A and B is equal to '0.5'. In some examples, the behavioral metrics module 616 provides data to the client interface 612 representing a layout of the diagram 900 highlighting features of the coupling score is output on the client.

By identifying patterns of specific node types (e.g., element types), such as operations and/or activities (e.g., send signal actions and accept event actions in the diagram 900), it is simple to ascertain how coupled operations are to other operations. The coupling score calculated from such patterns indicates a likelihood that changing a particular operation will impact other operations. In this manner, a user is able to discern whether these changes to the operations will be able to be refined to satisfy requirements of a project. In a conventional approach, such as the given example, where there are thousands of nodes in MBSE data, the coupling between nodes would be obfuscated.

Further, continuing with the diagram 900, suppose that the client queries for a cohesion score of the first behavior (Operation A) between Activity A1.1, represented as the first node 908 of Operation A and Operation A2.1, represented as the second node 920 of Operation A in the diagram 900. In this example, the behavioral metrics module 616 counts a number of owned input and output objects flows and control flows between call operation actions within the first behavior and divides by a maximum number of object flows and control flows across all activities on a given level to determine a cohesion score to an Operation that has a particular activity as an associated method.

In the diagram 900, there are two links 950 between the first node 908 and the second node 920 of Operation A, and there are four total links 954 between the first node 908, the second node 920 and the third node 936 of Operation A. Accordingly, the behavioral metrics module 616 reports a cohesion score of '0.5' for Operation A1.1 and Operation A2.1. In some examples, the behavioral metrics module 616 provides data to the client interface 612 representing a layout of the diagram 900 highlighting features of the cohesion score is output on the client.

As demonstrated by the cohesion score, internal components of an Operation can be analyzed by identifying input and output object flows and control flows. In some instances, Operations are expected to satisfy or refine Requirements of a project. Thus, if a change is made to a Requirement of the project, the cohesion score is employable to discern whether the change causes internal changes to related operations. Unintentional effects are not evident using conventional views of MBSE data.

Referring back to FIG. 6, the metrics modules include a structural metrics module 620. The structural metrics module 620 is employable to identify nodes in the graph data 604 that have incomplete structural branches.

Figure 10:
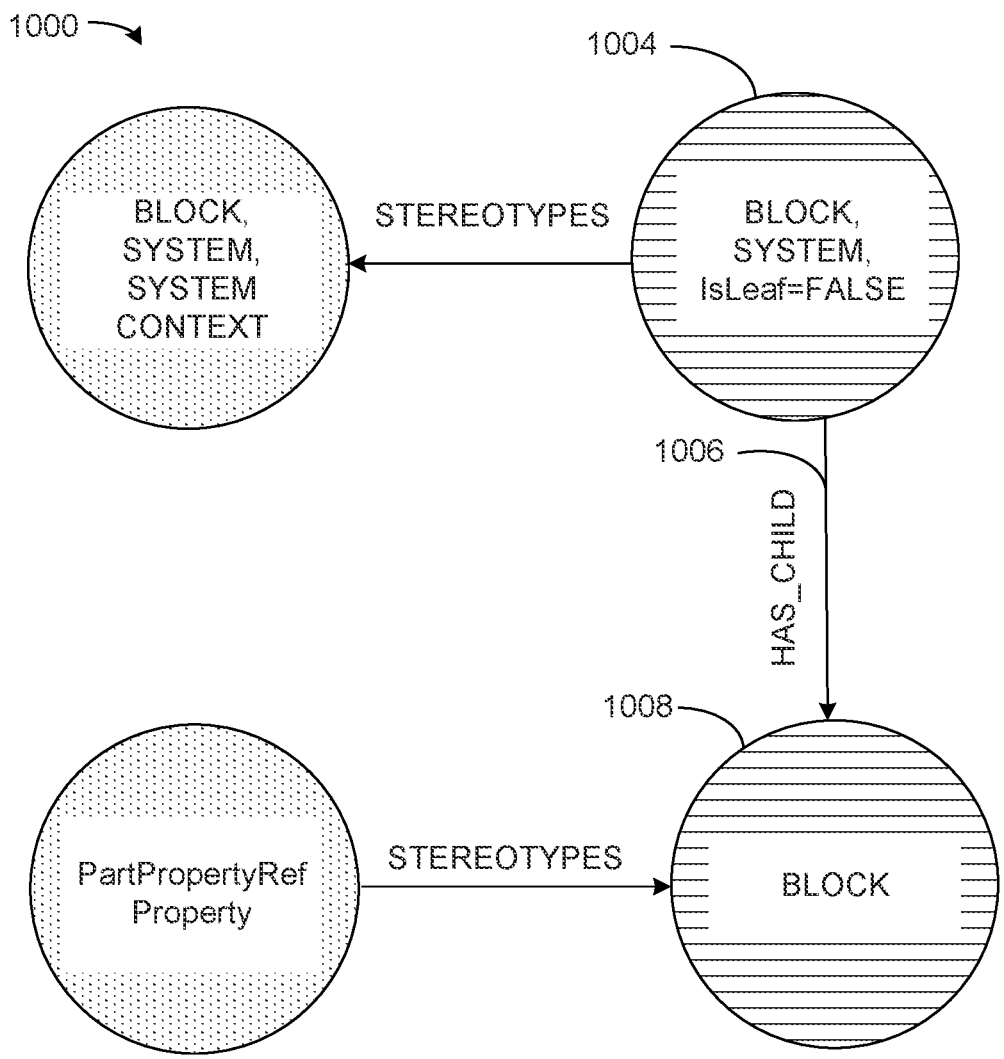
FIG. 10 illustrates a diagram depicting operations of the structural metrics module on graph data.

FIG. 10 illustrates a diagram 1000 depicting operations of the structural metrics module 620 on the graph data 604 of FIG. 6. For purposes of simplification, FIGS. 6 and 10 employ the same reference numbers to denote the same structure. The diagram 1000 is generated in response to a request from the client for nodes that are actually "leaf nodes", but erroneously have a value of false for a corresponding key of leaf node. Stated differently, the diagram 1000 is generated to identify nodes with a key-value pair for the key "IsLeaf" (or equivalent) being set to a value "false", when the value should be "true". In some examples, the structural metrics module 620 provides data to the client interface 612 representing a layout of the diagram 1000 highlighting features of the incomplete structural branches and the erroneously labeled leaf node(s).

In the diagram 1000 a first node 1004 has a link 1006 labeled "HAS_CHILD" to a second node 1008. Additionally, as illustrated, the first node 1004 has a key-value pair of "IsLeaf=false". However, because the first node 1004 has a child node (the second node 1008), the first node 1004 is value of "IsLeaf" of the first node 1004 is erroneous.

Using graph databases, it is relatively easy to execute gap analysis of definitions (e.g., block nodes) compared to elements of usage (e.g., child block nodes). If a particular block node is labeled as not having leaves, but does have child blocks, this indicates that a Boolean value (IsLeaf) is incorrect, and would thus would not be accounted for in any upstream and/or downstream analysis (e.g., block definition diagrams). Further, in some instances, the incomplete structural branches (if not detected) could cause early termination of an analysis of a block diagram encountering an erroneously labeled false leaf.

Referring back to FIG. 6, the metrics modules include a requirements metrics module 624. The requirements metrics module 624 is employable to count requirement relationships for a node (e.g., an element) of the graph data 604.

Figure 11:
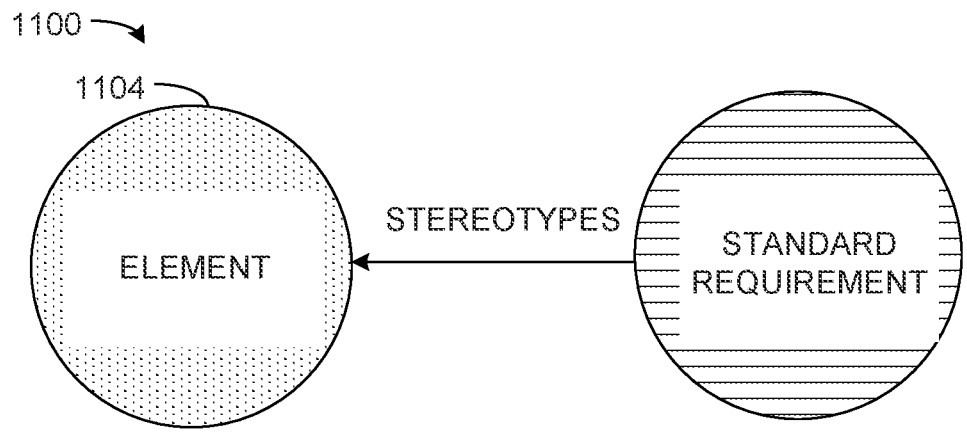
FIG. 11 illustrates a diagram depicting operations of the requirements metrics module on graph data.

FIG. 11 illustrates a diagram 1100 depicting operations of the requirements metrics module 624 on the graph data 604 of FIG. 6. For purposes of simplification, FIGS. 6 and 11 employ the same reference numbers to denote the same structure. The diagram 1100 is generated in response to a request from the client to identify and count a number of elements that satisfy a particular requirement stereotype. In the diagram 1100 is presumed that a node 1104 (labeled "element") meets this requirement. In the given example, it is presumed that the requirement is "The system shall have Mach X". In this situation, upon detecting the presence of the node 1104, the counter is incremented. In some examples, the requirements metrics module 624 provides data to the client interface 612 representing a layout of the diagram 1100 highlighting features of the showing how a counter is incremented.

By using graph databases, once again, gap analysis can be executed between a definition (Owning Elements) node verse usage (Elements). This enables the identification of additional relationships between specific elements of usage and other elements. Moreover, this allows (in the given example) to identify elements that are not accurately stereotyped by a standard requirement node, such that these matters are addressable to prevent costly reworking of the MBSE data in the future.

Referring back to FIG. 6, the metrics modules include an interface metrics module 628. The interface metrics module 628 is employable to identify ports that are not types by an interface block (e.g., a node type).

Figure 12:
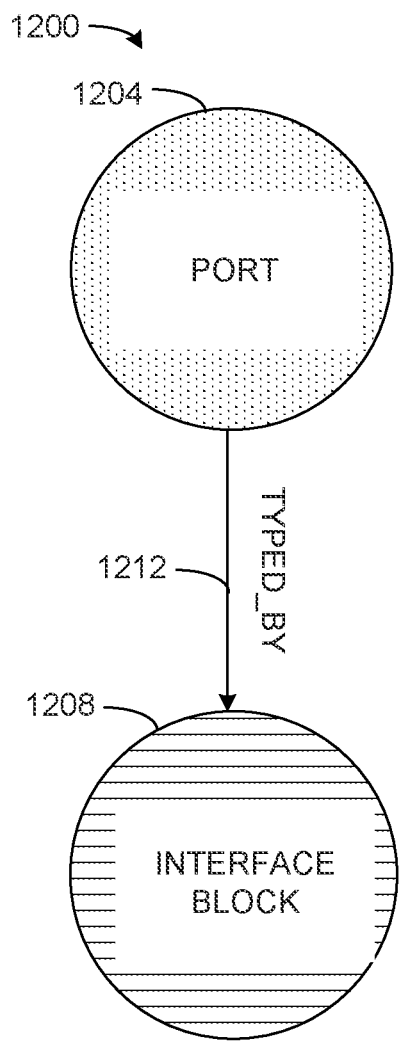
FIG. 12 illustrates a diagram depicting operations of an interface metrics module on graph data.

FIG. 12 illustrates a diagram 1200 depicting operations of the interface metrics module 628 on the graph data 604 of FIG. 6. For purposes of simplification, FIGS. 6 and 12 employ the same reference numbers to denote the same structure. In the diagram 1200, a first node 1204 (e.g., a port element) is linked to a second node 1208 by a link 1212 labeled "TYPED_BY". The interface metrics module 628 identifies the link 1212 if the relationship exists for relevant ports. For instance, suppose that the first node 1204 represents an Ethernet Port in the given example. Additionally, the second node 1208 represents a particular Ethernet Communication protocol in the given example. The link 1212 indicates that the second node 1208 is typed by the first node 1204. In some examples, the interface metrics module 628 provides data to the client interface 612 representing a layout of the diagram 1200 highlighting features showing how an interface metric is calculated.

Once again, graph data allows gap analysis between nodes (elements) of the graph database. In particular, the interface metrics module 628 allows a gap analysis between definition (Owning Ports) versus elements of usage (Ports). This gap analysis enables a user to identify which ports are not properly typed by an Interface Block element before proceeding with development to curtail reworking in the future development of a project.

Referring back to FIG. 6, the metrics modules include a parametric metrics module 632. The parametric metrics module 632 is employable to identify a constraint parameter without binding.

Figure 13:
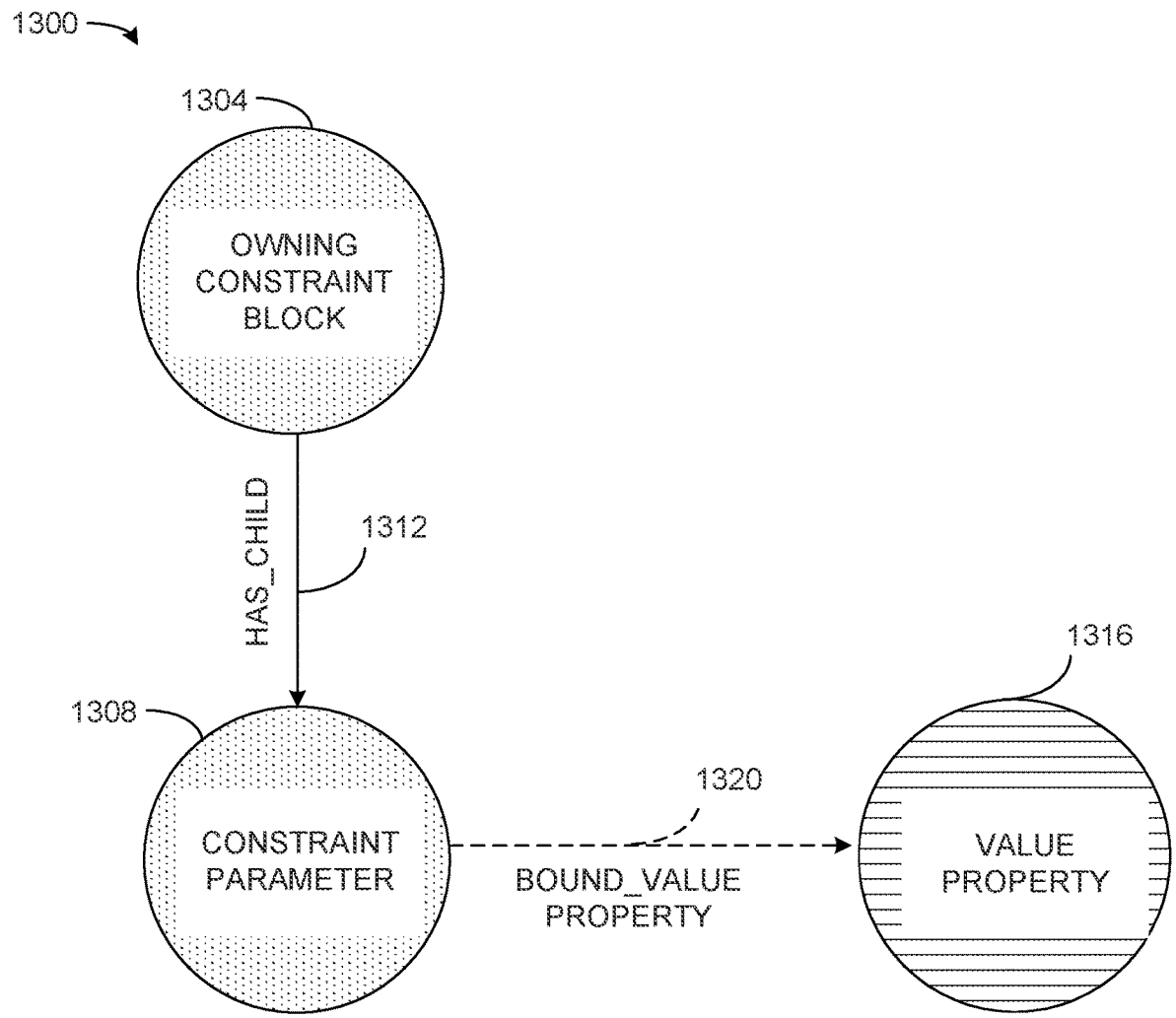
FIG. 13 illustrates a diagram depicting operations of the parametric metrics module on the graph data.

FIG. 13 illustrates a diagram 1300 depicting operations of the parametric metrics module 632 on the graph data 604 of FIG. 6. For purposes of simplification, FIGS. 6 and 13 employ the same reference numbers to denote the same structure. In the diagram 1300, a first node 1304 (e.g., an owning constraint block) is linked to a second node 1308 by a link 1312 labeled "HAS_CHILD". The second node 1308 should be linked to a third node 1316 through a missing link 1320 labeled "BOUND_VALUE_PROPERTY", depicted with a dashed line. The parametric metrics module 632 identifies the second node 1308 as a constraint parameter without a bounded value property. For instance, in the given example, the first node 1304 could represent Newton's second law of motion, F=m*a. In this situation, the second node 1308 could represent acceleration. Furthermore, the third node 1316 could represents a bounded value property of the acceleration of gravity on Earth (9.8 meters per second squared (m/s$^2$). However, because of the missing link 1320, the second node 1308 representing acceleration has no bounded value property. In some examples, the parametric metrics module 632 provides data to the client interface 612 representing a layout of the diagram 1300 highlighting features showing the missing link 1320.

Once again, graph data allows gap analysis between nodes (elements) of the graph database with parametric diagrams, including the diagram 1300. Parametric diagrams provide Constraint blocks (nodes) that own Constraint parameters (nodes). These parameters have input and output arguments that define how values are transformed with equations (e.g., F=m*a). Value properties (e.g., the third node 1316) provide numbers that connect to parameters in order to be transformed to these input/output values. If there is no bound value property, then the constraint cannot execute the assigned calculation. Accordingly, the parametric metrics module 632 reveals missing connections in parametric diagrams of the graph data 604.

Referring back to FIG. 6, FIGS. 7-13 demonstrate how visual representation of nodes of the graph data 604 are useful to enable analysis through queries to the graph data 604, including gap analysis on MBSE data, from which the graph data 604 is generated. Moreover, execution of the behavioral metrics module 616, the structural metrics module 620, the requirements metrics module 624, the interface metrics module 628 and the parametric metrics module 632 are not meant to be exclusive. It is common that the client may request a query to the graph data 604 that analyzes the same data in multiple ways during a gap analysis (or other analytic analysis).

Referring back to FIG. 1, as demonstrated in FIG. 6, the analytics engine 150 is employable to execute queries on the graph data 144 of the graph database 148 to reveal connections and/or errors that might be present in the MBSE data 136 of the K number of MBSE platforms 132 or some subset thereof. As explained with respect to FIGS. 7-13 conventional, text-only analysis of such MBSE data 136 is error prone and time consuming. Thus, by translating the instances of MBSE data 136 into the graph data 144 in the manner described, the underlining data and the interrelationships between nodes (or lack thereof) can be analyzed to facilitate project management of large-scale projects, such as the aircraft development in the given example.

Figure 14:
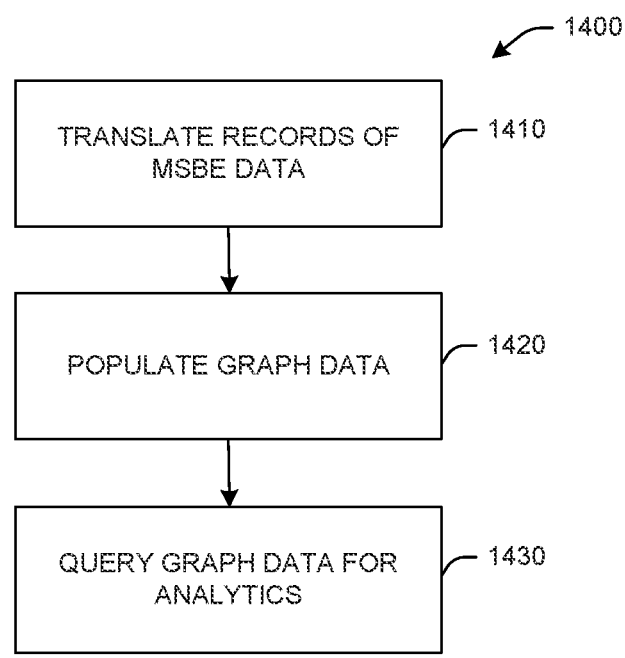
FIG. 14 illustrates a flow chart of an example method for translating and analyzing MBSE data.

In view of the foregoing structural and functional features described above, example methods will be better appreciated with reference to FIG. 14. While, for purposes of simplicity of explanation, the example methods of FIG. 14 are shown and described as executing serially, it is to be understood and appreciated that the present examples are not limited by the illustrated order, as some actions could in other examples occur in different orders and/or concurrently from that shown and described herein. Moreover, it is not necessary that all described actions be performed to implement a method. The example methods of FIG. 14 can be implemented as instructions stored in a non-transitory machine-readable medium. The instructions can be accessed by a processing unit and executed to perform the methods disclosed herein.

FIG. 14 illustrates a flow chart of an example method 1400 for translating and analyzing MBSE data, such as an instance of the MBSE data 136 of FIG. 1. The method 1400 can be executed, for example, by the server 104 of FIG. 1.

At 1410, a translator (e.g., the translator 140 of FIG. 1) translates records (e.g., nodes) in the MBSE data extracted from an MBSE platform to identify nodes and links for graph data (e.g., the graph data 144 of FIG. 1) for a graph database (e.g., the graph database 148 of FIG. 1).

The translating at 1410 can include, for example assigning a record title (e.g., a node identifier) extracted from a given record in the MBSE data to a title of a given node in the graph data. The translating can also include determining a category for the given node based on the element field (e.g., element type) of the given record.

At 1420, the translator can populate the graph data with the nodes and links from the records. This populating can include, for example, identifying fields in the given record that identify other records of the MBSE data. For instance, the fields in the given record that identify the other records of the MBSE platform can be assigned to actions (e.g., a category). The populating can also include generating a set of links between the given node and other nodes in the graph database based on the identified fields of the given record.

At 1430, an analytics engine (e.g., the analytics engine 150 of FIG. 1) can query the graph data of the graph database for metrics. For example, the graph data can be queries to reveal a subset of nodes of the nodes and links between the nodes of of the graph data. These queries are employable to reveal metrics related to the MBSE data, such as the metrics illustrated and described in FIGS. 6-13.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A non-transitory machine-readable medium having machine-executable instructions comprising a translator, the machine-readable instructions for the translator being executable by a processor core to perform operations comprising:
   translating records in model-based system engineering (MBSE) data for an MBSE platform to identify nodes and links for graph data of a graph database, wherein the translating comprises:
      assigning a record identifier extracted from a given record of the records to a title of a given node of the nodes;
      determining a category for the given node based on an element field of the given record;
      identifying fields in the given record that identify other records of the MBSE data; and
      generating a set of links between the given node and other nodes in the graph data based on the identified fields of the given record; and
   populating the graph data with the nodes and links from the translated nodes, wherein a query to the graph data of the graph database reveals a subset of the nodes and links between the nodes of the subset of nodes and other nodes of the nodes of the graph data.

2. The non-transitory machine-readable medium of claim 1, wherein operations for the translator further comprises generating bypass links between nodes of the nodes, wherein a bypass link connects a first node of the nodes and a second node of the nodes, wherein the first node and the second node are connected to a third node of the nodes.

3. The non-transitory machine-readable medium of claim 2, wherein the translating further comprises assigning fields in the given record that identify the other records of the MBSE data to actions.

4. The non-transitory machine-readable medium of claim 3, wherein operations for the translator further comprises determining a set of activities of the given record based on an identification of a field in the given record that does not identify another node in the MBSE data.

5. The non-transitory machine-readable medium of claim 3, wherein the machine-readable instructions further comprise a metrics engine being executable by the processor to perform operations for analyzing the graph data.

6. The non-transitory machine-readable medium of claim 5, wherein the metrics engine determines a strength of the actions of the given record based on a number of links to other nodes in the nodes of the graph data.

7. The non-transitory machine-readable medium of claim 6, wherein the subset of nodes is a first subset of nodes, and the analyzing for the metrics engine comprises identifying a second subset of nodes in the graph data that have links that form a logical loop.

8. The non-transitory machine-readable medium of claim 7, wherein the analyzing by the metrics engine comprises identifying a third subset of nodes of the nodes in the graph data that have links that are exactly one link away from forming a logical loop.

9. The non-transitory machine-readable medium of claim 8, wherein the third subset of nodes identifies nodes of the graph data of a particular category that are not linked to another node of the particular category.

10. A system for translating data, the system comprising:
    a non-transitory memory storing machine readable instructions; and
    a processor that accesses the non-transitory memory and executes the machine-readable instructions, the machine readable-instructions being executable by the processor to perform operations comprising:
       translating records in model-based system engineering (MBSE) data for an MBSE platform to identify nodes and links for graph data of a graph database, wherein the translating comprises:
          assigning a record title extracted from a given record of the records to a title of a given node of the nodes;
          determining a category for the given node based on an element field of the given record;
       populating the graph data with the nodes and links from the records of the MBSE data, wherein the populating comprises:
          identifying fields in the given record that reference other records of the MBSE data; and
          generating a set of links between the given node and other nodes in the graph data based on the identified fields of the given record of the MBSE data;
       wherein a query to the graph database reveals a subset of nodes of the nodes and links between the nodes of the subset of nodes and other nodes of the nodes of the graph data.

11. The system of claim 10, wherein the translating further comprises assigning the fields in the given record that identify the other records of the MBSE data to actions.

12. The system of claim 11, wherein the operations further comprise determining a strength of the actions of the given record based on a number of links to other nodes in the nodes of the graph data.

13. The system of claim 11, wherein the operations further comprise determining a set of activities of the given record based on an identification of a field in the given record that does not identify another node in the MBSE data.

14. The system of claim 11, wherein the operations further comprise creating bypass links between nodes of the nodes, wherein a bypass link connects a first node and a second node, wherein the first node and the second node are connected to a third node.

15. A method for translating data comprising:
    translating, by a translator executing on one or more computing devices, records in model-based system engineering (MBSE) data for an MBSE platform to identify nodes and links for graph data of a graph database, wherein the translating further comprises:
       assigning a record title extracted from a given record of the records to a title of a given node of the nodes;
       determining a category for the given node based on an element field of the given record; and
    populating, by the translator, the graph data with the nodes and links from the records in the MBSE data, wherein a query to the graph database reveals a subset of nodes of the nodes and links between the nodes of the subset of nodes and other nodes of the nodes of the graph database, wherein the populating further comprises:
       identifying fields in the given record that identify other records of the MBSE platform; and
       generating a set of links between the given node and other nodes in the graph database based on the identified fields of the given record.

16. The method of claim 15, wherein the translating further comprises assigning the fields in the given record that identify the other records of the MBSE platform to actions.

17. The method of claim 16, wherein the method further comprises determining, by a metrics engine executing on the one or more computing devices, a strength of the actions of the given record based on a number of links to other nodes in the nodes of the graph database.

18. The method of claim 16, wherein the method further comprises determining a set of activities of the given record based on an identification of a field in the given record that does not identify another node in the MBSE platform.

\* \* \* \* \*